United States Patent

Abernathey et al.

[11] Patent Number: 5,672,901
[45] Date of Patent: Sep. 30, 1997

[54] STRUCTURE FOR INTERCONNECTING DIFFERENT POLYSILICON ZONES ON SEMICONDUCTOR SUBSTRATES FOR INTEGRATED CIRCUITS

[75] Inventors: John Robert Abernathey, Underhill; Randy William Mann, Jericho; Paul Christian Parries, Essex Junction; Julie Anne Springer, Burlington, all of Vt.

[73] Assignee: International Business Machines Corporation, Armonk, N.Y.

[21] Appl. No.: 702,863

[22] Filed: Aug. 26, 1996

Related U.S. Application Data

[60] Continuation of Ser. No. 439,394, May 11, 1995, abandoned, which is a division of Ser. No. 6,662, Jan. 19, 1993, Pat. No. 5,453,400, which is a continuation of Ser. No. 545,909, Jun. 28, 1990, abandoned.

[51] Int. Cl.$^6$ .................. H01L 23/532; H01L 23/535
[52] U.S. Cl. .................. 257/413; 257/383; 257/384; 257/754; 257/755
[58] Field of Search .................. 257/382–385, 257/754–757, 412, 413, 763, 764

[56] References Cited

U.S. PATENT DOCUMENTS

| | | | |
|---|---|---|---|
| 4,102,733 | 7/1978 | De La Moneda | 156/653 |
| 4,374,700 | 2/1983 | Scott et al. | 156/656 |
| 4,458,410 | 7/1984 | Sugaki et al. | 29/571 |
| 4,462,149 | 7/1984 | Schwabe | 29/571 |
| 4,463,491 | 8/1984 | Goldman et al. | 29/571 |
| 4,476,482 | 10/1984 | Scott et al. | 357/71 |
| 4,519,126 | 5/1985 | Hsu | 29/571 |
| 4,714,951 | 12/1987 | Baudrant et al. | 357/67 |
| 4,745,081 | 5/1988 | Beyer et al. | 437/38 |
| 4,777,150 | 10/1988 | Deneuville et al. | 437/200 |
| 4,873,204 | 10/1989 | Wong et al. | 437/200 |
| 4,873,205 | 10/1989 | Critchlow et al. | 437/200 |
| 5,223,456 | 6/1993 | Malwah | 257/384 |
| 5,294,822 | 3/1994 | Verrett | 257/382 |
| 5,349,229 | 9/1994 | Wei et al. | 257/383 |
| 5,418,179 | 5/1995 | Hotta | 257/384 |

FOREIGN PATENT DOCUMENTS

| | | | |
|---|---|---|---|
| 0046371 | 8/1981 | European Pat. Off. | |
| 0192079 | 11/1982 | Japan | 257/384 |
| 0100451 | 6/1983 | Japan | |
| 0175726 | 10/1984 | Japan | 437/200 |
| 0130155 | 7/1985 | Japan | |
| 0020374 | 1/1987 | Japan | 257/384 |
| 0227045 | 9/1988 | Japan | 257/382 |
| 0313855 | 12/1988 | Japan | 257/384 |
| 0157523 | 6/1989 | Japan | 437/200 |
| 0281755 | 11/1989 | Japan | 257/382 |
| 0009524 | 1/1991 | Japan | |
| 2151847 | 7/1985 | United Kingdom | 437/200 |

OTHER PUBLICATIONS

IEEE Transactions, Ed. 34, No. 3, Mar., 1987, "HPSAC—A Silicided Amorphous–Silicon Contact and Interconnect Technology for VLSI" pp. 587–592.
IEEE Transactions, Dec., 1988, pp. 450–453, "A Selective CVD Tungsten Local Interconnect Technology," Lee, et al.
Murarka, S.P., "Refractory Silicides for Integrated Circuits," J. Vac. Sci. Tech., vol. 17, No. 4, Jul./Aug., 1980, pp. 777–792.
Wolf, S., "Silicon Processing for the VLSI Era," vol. 2, Process Integration, Lattice Press, 1990, pp. 160–169.

Primary Examiner—Peter Toby Brown
Attorney, Agent, or Firm—Calfee, Halter & Griswold LLP

[57] ABSTRACT

A method of forming interconnections of devices of integrated circuits, especially interconnecting spaced source/drain regions and/or gate regions, and the resulting structures are provided. An etch-stop material such as silicon dioxide is deposited over the entire substrate on which the devices are formed. A layer of silicon is deposited over etch-stop material, and the silicon is selectively etched to reveal the etch-stop material at the regions to be connected. The etch-stop material at those regions is then removed. Following this a high-conductivity material, which is either a refractory metal or a silicide formed from layers of silicon and a refractory metal, is formed on the substrate connecting the spaced regions.

4 Claims, 4 Drawing Sheets

STRUCTURE FOR INTERCONNECTING DIFFERENT POLYSILICON ZONES ON SEMICONDUCTOR SUBSTRATES FOR INTEGRATED CIRCUITS

This is a continuation of Ser. No. 08/439,394, filed May 11, 1995, now abandoned; which is a division of Ser. No. 08/006,662, filed Jan. 19, 1993, now U.S. Pat. No. 5,453,400; which is a continuation of Ser. No. 07/545,909, filed Jun. 28, 1990, now abandoned.

BACKGROUND OF THE INVENTION

In production of integrated circuits on semiconductor substrates, it is often necessary to selectively interconnect various doped zones or other different regions, connections or electrodes of the devices which are formed on the semiconductor substrate. For example, in FET Technology, it is often necessary to connect selectively gate electrodes to source/drain diffusions or to connect different gate electrodes together, or to connect different source/drain regions together. In forming the devices, it is necessary to provide interconnections which connect selectively only those regions which are desired to be interconnected and to prevent connections of those regions which must be electrically isolated, and which during processing require steps or techniques which assure that they will not be interconnected.

The interconnection between the various zones or regions is desirably done by material which has a very high conductivity (i.e. a very low resistance). Thus, the interconnection should be done with materials that have very low resistivity so that minimal amounts of material can be used to provide the desired interconnection, and yet with these materials, the interconnections must be reliably made without shorting to undesired regions or without resulting opens or regions of high resistance within the interconnect lines or at the connections of the interconnect lines to the various regions.

There have been several prior art proposals for such type of interconnections, and included in these proposals is the use of various silicides such as has been shown in an article entitled *HPSAC-A Silicided Amorphous-Silicon Contact and Interconnect Technology for VLSI* by Wong, et al. in the IEEE Transactions on Electron Devices in Vol. ED-34, No. 3, March 1987, 587–592. Also, a related technology using tungsten is disclosed in an article entitled *A Selective CVD Tungsten Local Interconnect Technology* by V. V. Lee, et al. in the International Electron Devices Meeting, Nichol Digest, 1988, Pages 450–453. Additionally, U.S. patent application Ser. No. 135,953 filed Dec. 21, 1987 entitled Method for Providing Bridge Contact Between Silicon Regions Separated By a Thin Dielectric, now abandoned (IBM Docket No. BU9-87-034), and IBM Technical Disclosure Bulletin, Vol. 32, No. 9A, Pages 433–434 entitled *Multi-Purpose Trench For a Complimentary Metal Oxide Silicon (CMOS), Six Device Static Random Access Memory (SRAM) Cell* show the use of silicides as a strap for interconnection between spaced doped regions or connecting of polysilicon regions to doped regions. U.S. Pat. Nos. 4,714,951; 4,374,700; 4,873,204; 4,462,149; 4,463,491; and European Patent Publication No. 0046371 show the use of silicides in various configurations. Further, U.S. Pat. No. 4,745,081 shows a type of interconnect technology substrate contact with trench isolation areas. The article *Titanium Nitride Local Interconnect Technology for VLSI* by T. E. Tang et al. in IEEE Transactions on Electron Devices, Vol. Ed. 34, No. 3, March 1987 pp. 682–687, and report of 44th Annual Device Research Conference, Jun. 23–25, 1986; both show TiN technology for device interconnection.

SUMMARY OF THE INVENTION

According to the present invention, a method of forming an interconnection between spaced regions in an integrated circuit and the resulting interconnection structure are provided. The method includes depositing or growing a layer of etch-stop material over the doped silicon regions to be connected. A layer of silicon is deposited over the etch-stop material, and the silicon is selectively etched to reveal the etch-stop material at the regions of the doped silicon to be connected. The etch-stop material is then removed at the locations to be connected. Following this, high-conductivity a material or a material that can be made to have high-conductivity by conversion to silicide is grown over the revealed doped silicon locations and the remaining deposited silicon. This process results in the selective connection of desired spaced doped silicon regions while preventing unwanted or unintended connections to doped regions which are to be isolated from the connected regions. In one embodiment of this technology, the high-conductivity material is a silicide which is formed in situ, and in another embodiment, the high-conductivity material is a refractory metal such as tungsten.

DESCRIPTION OF THE PREFERRED EMBODIMENTS

Figure 1A:
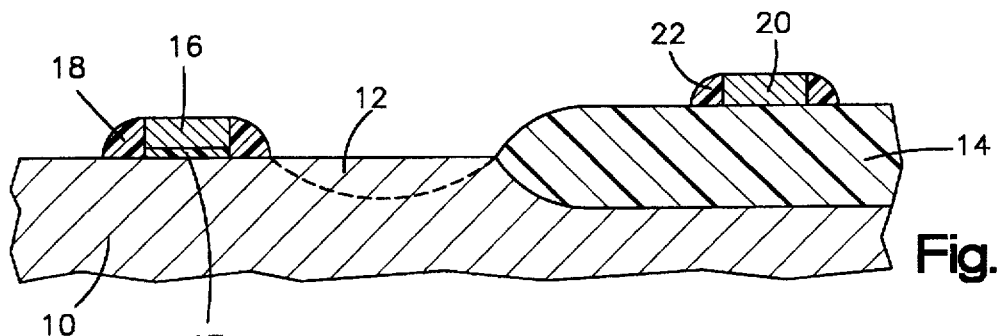
FIGS. 1A through 1E depict somewhat diagrammatically the various steps the present invention which are common to all of the embodiments.
Figure 1B:
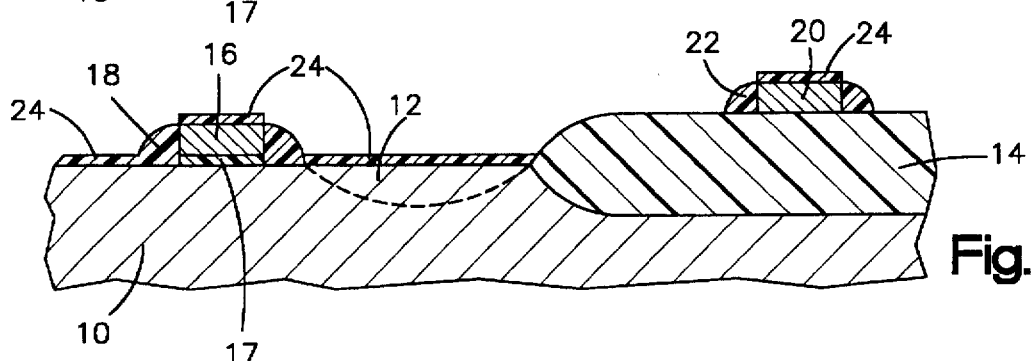

Referring now to the drawing and, for the present, to FIGS. 1A through 1E, the various initial steps utilized in practicing the present invention for forming integrated circuits, which are common to all of the embodiments, are shown. In depicting these steps, a portion of a single crystal silicon wafer is shown, but this depiction is very schematic and diagrammatic and is simplified to depict the inventive aspects of the present invention.

Referring now to FIG. 1A, a single crystal silicon substrate 10 is shown having a conventional doped region 12 formed therein which can be either a "P" or "N" type doping depending upon the particular technology being used. Indeed "P" and "N" dopings can both be used in the same substrate and the particular dopant is not critical for the present invention. A region of recessed oxide (ROX) 14 is shown which is a silicon dioxide material grown on the silicon substrate 10. A gate electrode 16 of doped polysilicon is shown which is supported on a pad 17 of dielectric material such as silicon dioxide. Conventionally, the gate electrode 16 will have isolation side walls 18 therearound formed of silicon dioxide or some other dielectric material. A second pad 20 of doped polysilicon material is shown on the recessed oxide 14. Conventionally, this pad 20 is an extension of another gate and at the location shown is used as its own interconnection line supported on top of the recessed oxide 14. The pad 20 of doped polysilicon is also surrounded by dielectric side walls 22 again preferably formed of grown silicon dioxide. The processing of a wafer from a silicon substrate to this point to form an integrated circuit is conventional, and is well know to those skilled in the art.

A layer of etch-stop material 24 is provided over all of the exposed doped silicon regions. In the preferred embodiment, this is a silicon dioxide which is formed on the exposed surfaces of the various regions of doped silicon. However, other etch-stop materials could be used, silicon dioxide being a conventional and convenient material for this purpose. The silicon dioxide etch-stop layer 24 can be formed by either low pressure chemical vapor deposition (LPVCD) or by conventional oxidation processes in an oxygen ambient atmosphere at temperatures above about 750° C. As indicated above, however, other etch-stop materials, such as silicon nitride could be used and applied in a conventional manner.

Figure 1C:
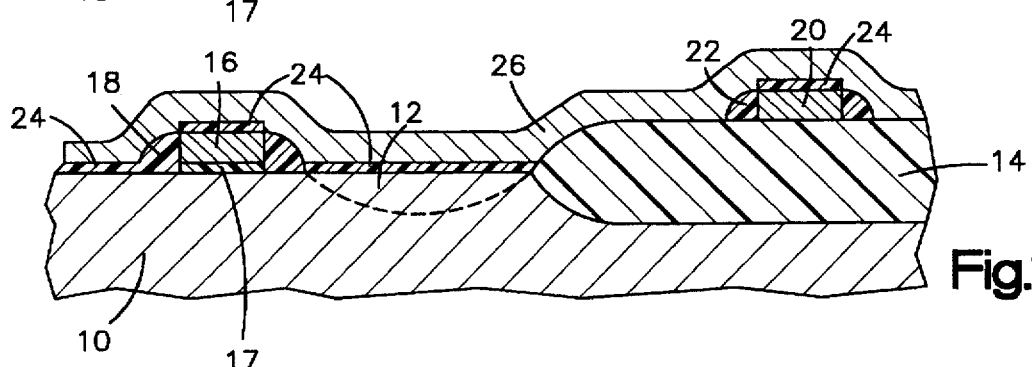

A layer of polysilicon 26 is deposited over the entire surface of the wafer structure as shown in FIG. 1C. This is referred to as intrinsic polysilicon and a preferred technique is by LPCVD Si deposition using silane ($SiH_4$) to form an approximately 1000 angstroms thick layer.

Figure 1D:
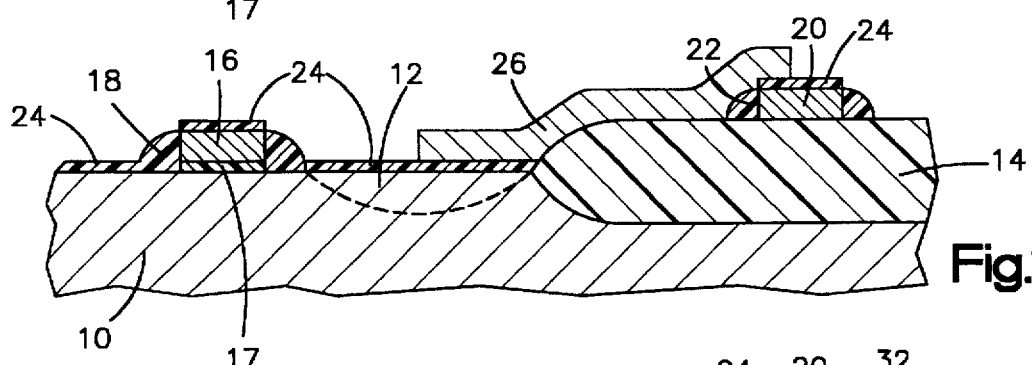
Figure 1E:
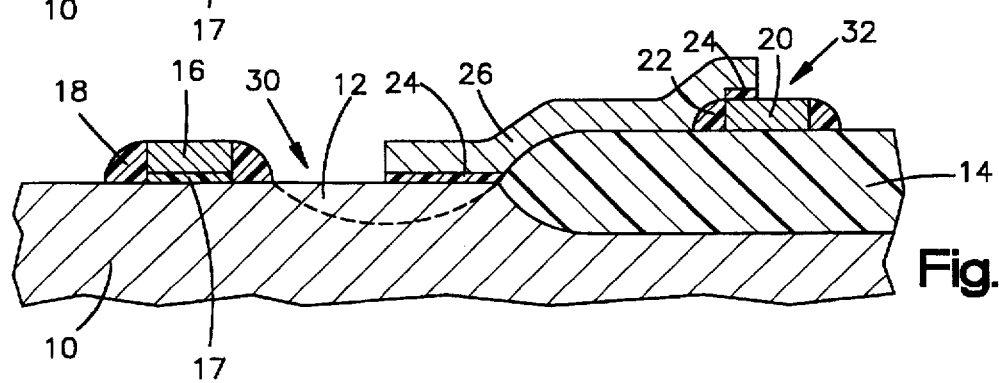

Following the deposition of the polysilicon layer 26 as shown in FIG. 1C, the polysilicon 26 is patterned and etched according to standard photoresist photolithographic technology to reveal the regions of the etch-stop material 24 overlying the underlying doped silicon regions which are to be connected; i.e. the portion of the diffusion zone 12 which may be a source/drain region and a portion of the pad 20 which, as indicated above is an extension of a gate to provide the structure in FIG. 1D. Photoresist and etching techniques are common and well known in the art. The photoresist may be either positive or negative and is imagewise exposed and developed to transfer a pattern to the underlying polysilicon. The polysilicon can be etched in either a dry or wet chemical environment. A typical dry etch gas, having adequate selectivity of silicon to oxide, is $NF_3$. At this point, it should be noted that one of the important features of the present invention is the provision of the etch-stop layer 24 so that in patterning and etching the polysilicon layer 26, the underlying doped region 12 of the substrate 10 is protected and unaffected by the etching process used to pattern the polysilicon 26. Following the etching of the polysilicon 26, the revealed portions of the etch-stop layer 24 are removed as shown in FIG. 1E to provide an opening 30 to a portion of the doped silicon region 12 and an opening 32 to a portion of the underlying doped polysilicon pad 20. Buffered hydrofluoric acid (BHF) is used to isotropically remove the oxide etch stop. As indicated above, the steps leading up to and the resulting structure in FIG. 1E are common to all of the embodiments of the present invention for connecting gate electrodes to source/drain regions. The various embodiments utilize the structure shown in FIG. 1E as the basis for the further steps for the different embodiments, providing the different resulting structures.

Figure 2A:
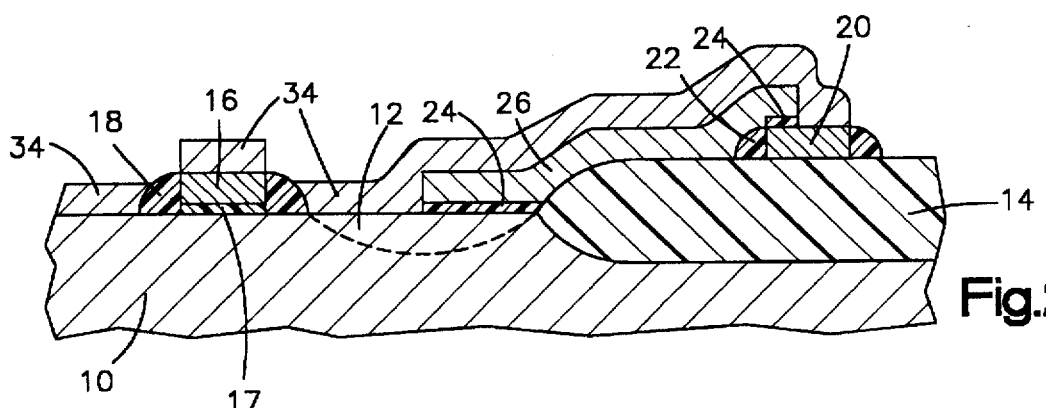
FIG. 2A shows a step subsequent to the step depicted in FIG. 1E for forming the interconnection according to one embodiment of this invention.

Referring now to FIG. 2A, one embodiment of forming the interconnection between the doped silicon source/drain region 12 and the polysilicon region 20 is shown. In this embodiment, the structure of FIG. 1E is used as the starting structure and a layer of tungsten is selectively grown on all of the exposed silicon surfaces, i.e. the silicon layer 26, the surface of the pad 20 which is exposed and the surface of the pad 16 which is exposed. This layer is designated by the reference character 34. It is important to note that the term selective growth of the tungsten refers to the fact that it grows only on the polysilicon or the doped silicon substrate and not on the oxide. Hence, the oxide side wall barrier 18 around the pad 16 prevents the interconnection of the pad 16 to the source/drain region 12 or the pad 20 by providing an insulating function even though the tungsten does grow on the pad 16 while permitting connection of the pad 20 to source/drain region 12. Tungsten may be selectively grown on silicon substrates using hydrogen ($H_2$) or silane ($SiH_4$) reduction of tungsten hexafloride ($WF_6$) in a LPCVD reactor at temperatures in the range of 250°–500° C. Because of this selectivity, the tungsten 34 on the pad 16 does not form a connection or bridge with the tungsten 34 overlying the doped silicon source/drain region 12. Tungsten is a preferred material for this interconnection because of several properties which it possesses. These properties include a high-conductivity, i.e. a low resistivity which allows for good electrical interconnections with the very small line sizes which are required in VLSI semiconductor technology. Also, tungsten has the characteristic of being able to be selectively grown or deposited on the silicon and not on the silicon dioxide, thereby allowing the isolation of those exposed silicon regions to which connection is not desired.

Figure 2B:
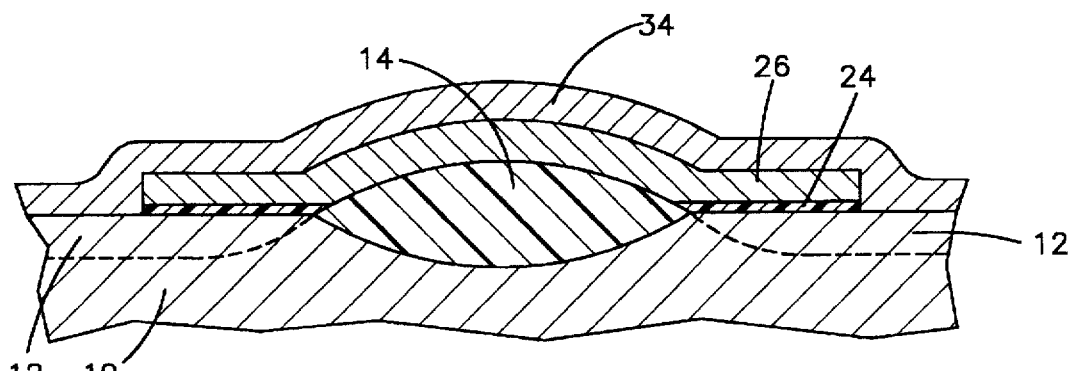
FIG. 2B is a figure similar to FIG. 2A but showing the resultant structure forming an interconnection between two diffusion regions rather than a diffusion region and a gate region.

FIG. 2B is a figure similar to 2A showing the resultant structure of this embodiment of the invention when it is utilized to connect two doped silicon source/drain regions located on opposite sides of the ROX 14 as opposed to connecting a gate electrode to a source/drain region as depicted in FIG. 2A. It is also to be understood that similar processing steps could be used to connect two gate regions or any other two polysilicon regions.

Figure 3A:
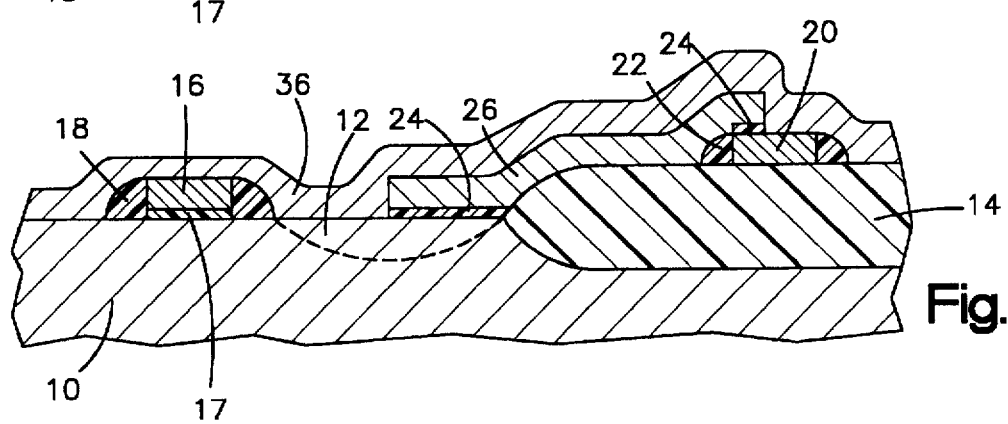
FIGS. 3A through 3C show successively the steps following the step used to produce FIG. 1E for another embodiment of this invention.
Figure 3B:
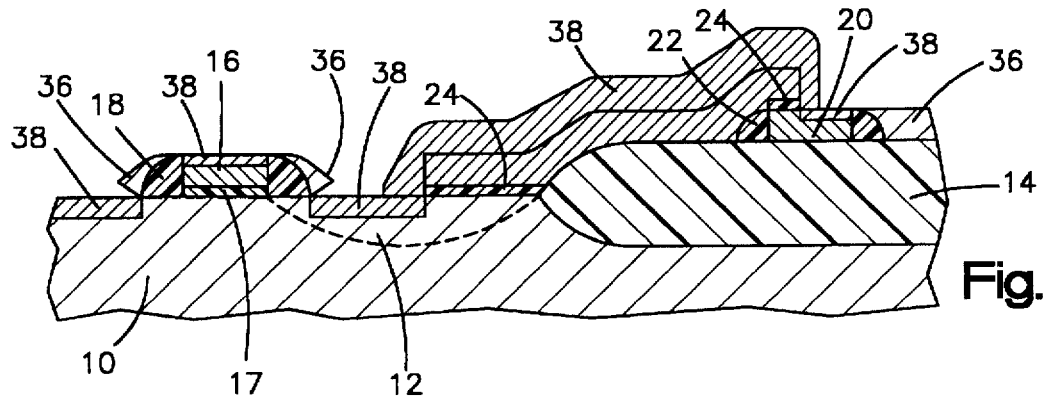
Figure 3C:
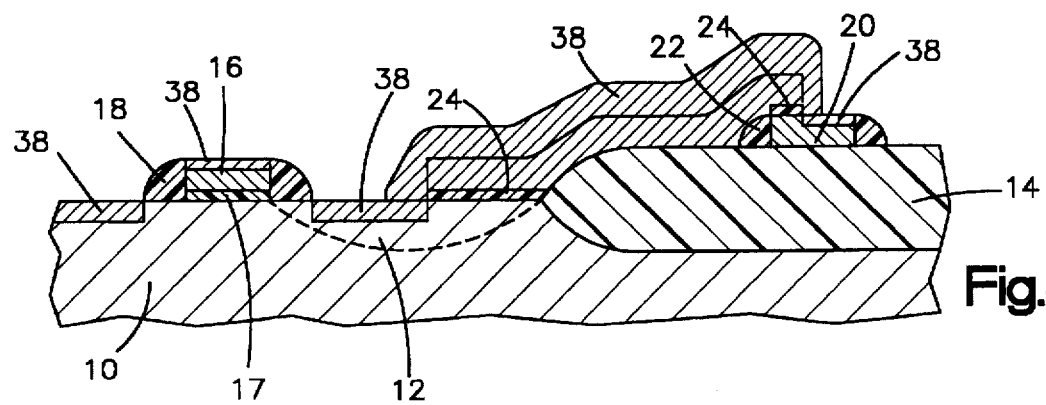

Referring now to FIGS. 3A through 3C, the interconnection of the pad 20 and a portion of the region 12 according to another embodiment of the present invention is shown. This embodiment uses a silicide technology for the connection. As shown in FIG. 3A, a layer of titanium 36 is sputtered (or deposited by some other means) over the entire substrate including being deposited over the polysilicon layer 26 and the exposed portions of pads 16 and 20. The deposition of titanium is conventional and can be accomplished according to the following process: Titanium is sputter deposited using a titanium target and an argon ion beam at a pressure of 2–12 mTorr. The resulting structure, as shown in FIG. 3A with the titanium deposited thereon is then heated to form titanium silicide 38. This heating to perform the silicidation can be accomplished by annealing in a nitrogen ambient atmosphere at temperatures between about 650° C. and 700° C. Following the forming of the titanium silicide 38, the titanium which was not formed into a silicide is removed. This is the titanium which was not in contact with the silicon, e.g. that which is on the side wall spacers 18 and on the recessed oxide layer 14 and which remained as titanium metal or was converted to titanium nitride during silicidation. This titanium and/or titanium nitride 36 can be removed in a conventional way such as by a wet etch in Huang A reagent ($H_2O_2$: $NH_4OH$: $H_2O$) at about 65° C. for about 5–10 minutes with the resulting structure as shown in FIG. 3C.

Figure 3D:
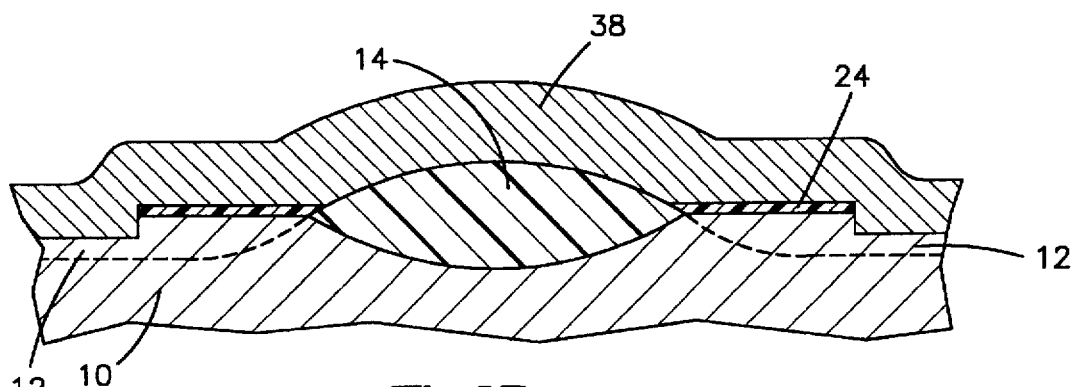
FIG. 3D shows the resulting structure where the embodiment of FIGS. 3A through 3C are utilized to connect two diffusion regions rather than a diffusion region and a gate region.

FIG. 3D depicts a resulting structure for this particular embodiment of the invention when it is used to connect two doped silicon regions separated by recessed oxide. The steps are the same with the resulting structure being the structure shown in FIG. 3D.

The titanium silicide formed in this process has a very high conductivity (i.e. low resistance) and provides a good interconnection between the source/drain layer 12 and the pad 20 as shown in FIG. 3C. However, there are certain characteristics of this process that in some instances render it less desirable than the previously described process or the process which will be described subsequently. These factors include the fact that the titanium 36 which overlies the silicon 26, and particularly the doped silicon layer 12, forms the silicide. The silicide tends to sink into the silicon as it is formed, thus causing a rather steep step between the etch-stop layer 24 and the surface of the substrate 10 and also the surface of the pad 20. Thus, care must be taken to assure that there is a good bridging over of this step by the silicide material to insure good electrical contact.

Figure 4E:
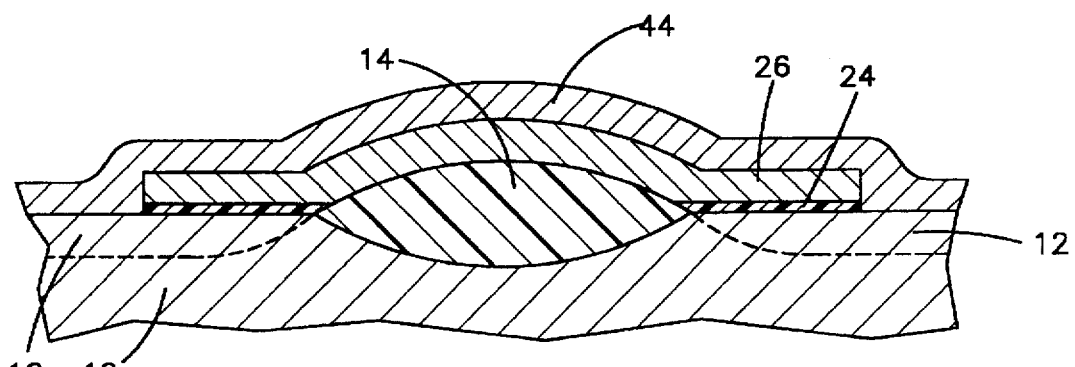
FIG. 4E shows the resulting structure of an embodiment similar to FIGS. 4A through 4D in which the resulting structure connects two diffusion regions rather than a diffusion and a gate region of the devices.
Figure 4A:
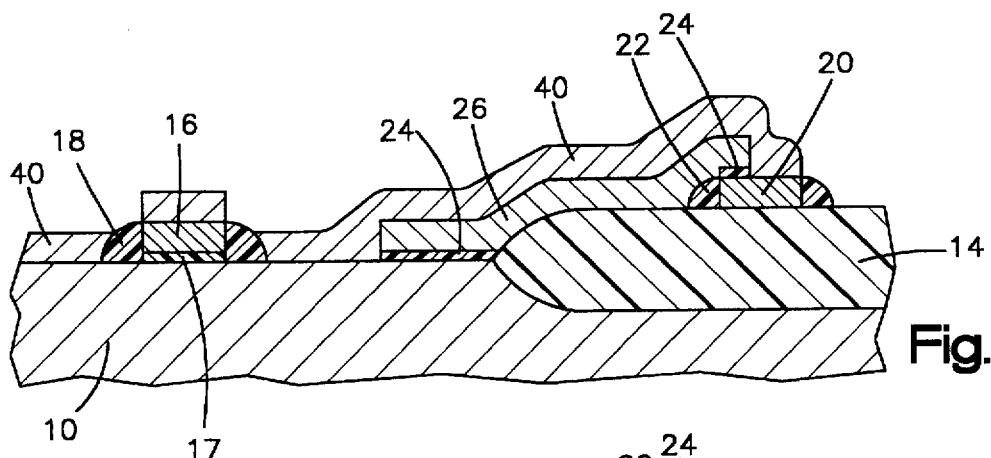
FIGS. 4A through 4D show the steps for practicing another embodiment of this invention following the step used to form FIG. 1E.
Figure 4B:
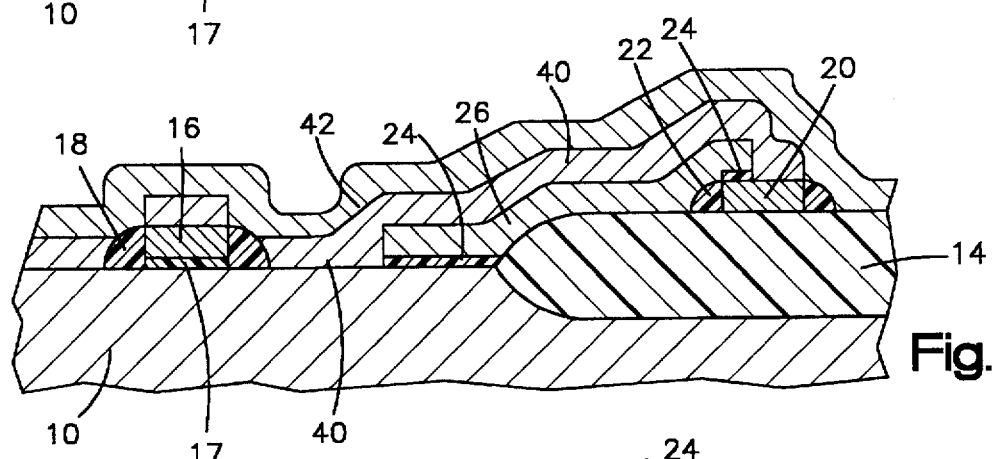
Figure 4C:
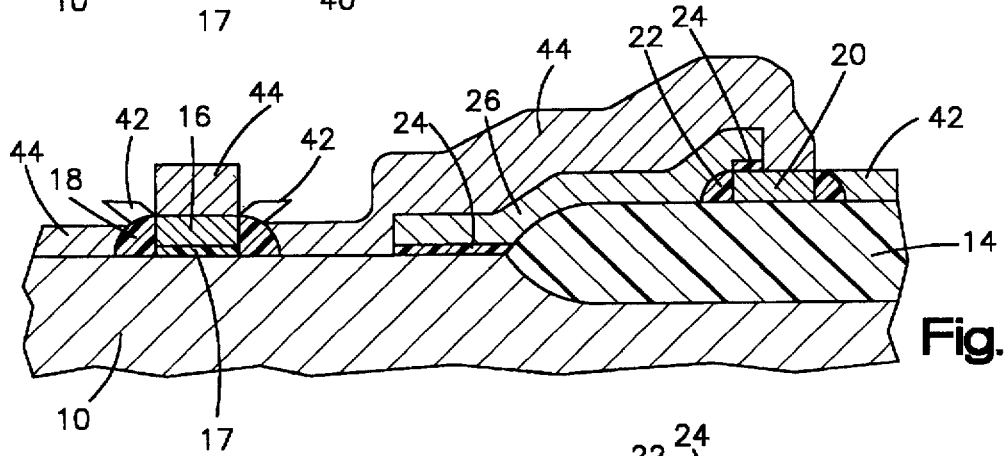
Figure 4D:
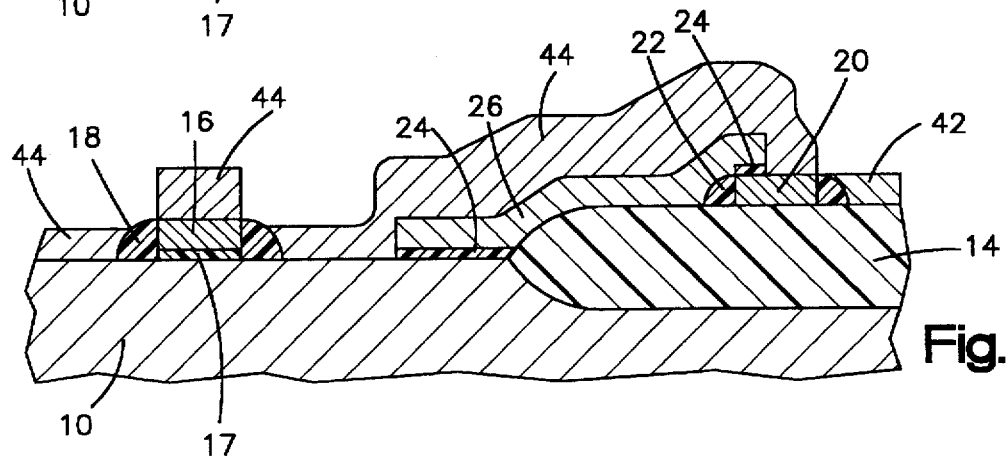

Another embodiment of the invention is shown in FIGS. 4A through 4D. For this embodiment also the starting structure is that shown in FIG. 1E. On top of this structure a layer of intrinsic silicon 40 is selectively deposited. This layer of intrinsic silicon 40 is deposited or grown on all exposed silicon surfaces, i.e. on the surface of the silicon 26, on the surface of the doped source/drain region 12 that is exposed, and on the surface of the gate electrode 16 and on the surface of the pad 20 which is exposed as shown in FIG. 4A. This can be accomplished by selective epitaxial growth (SEG) of Si on precleaned Si surfaces which may be performed in a LPCVD reactor at temperatures between about 800° C. and 950° C. using dichlorosilane ($SiCl_2H_2$), or other chlorosilane gasses and HCl gasses. Following this, a layer of titanium 42 is applied in a manner similar to that as previously described with respect to the embodiment shown in FIGS. 3A through 3C. The entire substrate is then heated as previous described to react the titanium 42 with the underlying silicon 40 to form a titanium silicide 44 as shown in FIG. 4C.

The advantage of this particular process over that shown in FIGS. 3A through 3C is that there is an additional layer of silicon to afford reactive material for the "step" bridging the etch-stop material 24 and thus better insure a good connection over this step. Again, as described with respect to FIG. 3C, the remaining unreacted titanium 42 shown in FIG. 4C is removed as previously described resulting in the structure shown in FIG. 4D.

FIG. 4E shows the resulting structure using the technique shown in FIGS. 4A through 4D for connecting source/drain regions separated by recessed oxide.

While several embodiments of the invention have been shown and described, various adaptations and modifications can be made without departing from the scope of the invention as defined in the appended claims.

What is claimed is:

1. An integrated circuit comprising, a silicon substrate having spaced doped regions of silicon;

a first insulator separating said spaced doped silicon regions, a second insulator distinct from said first insulator overlying a first portion of each doped region, an interconnection conductor interconnecting said spaced doped silicon regions;

said interconnection conductor being comprised of a layer of intrinsic polysilicon overlying said first and second insulators and a layer of refractory metal silicide overlying said polysilicon layer and contacting a second portion of each of said doped silicon regions without extending into said doped silicon regions.

2. The invention as defined in claim 1 further characterized by a region of silicon separate from said spaced doped silicon region having isolating barrier means therearound, and having disposed thereon the same material as the interconnection conductor.

3. The invention as defined in claim 2 wherein said separate region is polysilicon, and said isolation barrier is silicon dioxide.

4. The invention as defined in claim 1 wherein said refractory metal silicide is tungsten or titanium silicide.

* * * * *